(12) United States Patent
Zhang et al.

(10) Patent No.: US 7,612,439 B2
(45) Date of Patent: Nov. 3, 2009

(54) SEMICONDUCTOR PACKAGE HAVING IMPROVED THERMAL PERFORMANCE

(75) Inventors: Xiaotian Zhang, San Jose, CA (US); Argo Chang, Taipei (TW); James Lee, Taipei (TW); Ryan Huang, Taipei (TW); Kai Liu, Sunnyvale, CA (US); Ming Sun, Sunnyvale, CA (US)

(73) Assignee: Alpha and Omega Semiconductor Limited, Hamilton (BM)

( * ) Notice: Subject to any disclaimer, the term of this patent is extended or adjusted under 35 U.S.C. 154(b) by 291 days.

(21) Appl. No.: 11/316,614

(22) Filed: Dec. 22, 2005

(65) Prior Publication Data

US 2007/0145609 A1 Jun. 28, 2007

(51) Int. Cl.
*H01L 23/495* (2006.01)
*H01L 23/48* (2006.01)

(52) U.S. Cl. .............. 257/676; 257/E23.037; 257/E23.044; 257/E23.069; 257/E23.071; 257/E23.178; 257/666; 257/686; 257/685; 257/724; 257/723; 257/691; 257/698; 257/696; 257/773; 257/341

(58) Field of Classification Search .......... 257/676, 257/666, 724, 723, 686, 685, 341, E23.044, 257/773, E23.037, E23.069, E23.071, E23.178, 257/696, 698, 691
See application file for complete search history.

(56) References Cited

U.S. PATENT DOCUMENTS 6,593,622 B2 * 7/2003 Kinzer et al. ............... 257/341
7,215,012 B2 * 5/2007 Harnden et al. ............. 257/676

* cited by examiner

*Primary Examiner*—Alexander O Williams
(74) *Attorney, Agent, or Firm*—Schein & Cai LLP; Douglas E. MacKenzie; Jingming Cai

(57) ABSTRACT

A composite semiconductor package is disclosed. The package includes a lead frame having first and second die bonding pads, the first and second die bonding pads having a large lateral separation therebetween, a first device bonded to the first die bonding pad, a second device bonded to the second die bonding pad, a plurality of first leads coupled to the first die bonding pad, a plurality of second leads coupled to the second die bonding pad, and an encapsulant covering the lead frame, the first and second devices and at least a portion of the first and second pluralities of leads. The package may be a TSSOP-8 composite package having a common drain MOSFET pair and an IC.

12 Claims, 2 Drawing Sheets

SEMICONDUCTOR PACKAGE HAVING IMPROVED THERMAL PERFORMANCE

FIELD OF THE INVENTION

The present invention relates generally to semiconductor packaging and more particularly to a TSSOP-8 semiconductor package including a lead frame design which provides for improved package thermal performance.

BACKGROUND OF THE INVENTION

With the increased use of mobile devices such as cellular telecommunication products, portable digital assistants, and tablet PCs, the size, weight and cost of individual electronic components and devices are factors critical to a successful design. Integration of several electronic devices into a single semiconductor package has served this purpose by providing composite or co-packaged devices having the same small package form factor of discreet device packages.

It is known in the art to package a pair of power MOSFETs in a common drain configuration with an integrated circuit (IC) in a TSSOP-8 package. One such package 100 is shown in FIG. 1 and includes a first power MOSFET 105, a second power MOSFET 110 coupled to the first power MOSFET 105 in a common drain configuration, and an IC 115. The first and second power MOSFETs 105 and 110 and the IC 115 are shown bonded to a single lead frame pad 120. First and second power MOSFETs 105 and 110 are conventionally bonded to the lead frame pad 120 with conductive epoxy while the IC 115 may be bonded with non-conductive epoxy. A plurality of leads 125 may be provided for connection of the package 100 to a printed circuit board (PCB). Leads 125 may extend outside of an encapsulant body 130 and provide connection to power MOSFET source and gate contact areas and to IC contacts.

A problem associated with the design of composite or co-packaged devices such as package 100 is that heat generated within the package 100 may adversely affect the operation of first and second MOSFETs 105 and 110 and IC 115. Typically, first and second MOSFETs 105 and 110 are designed to operate in a temperature range having an upper limit of 150° C. while IC 115 is designed to operate in a temperature range having an upper limit of 85° C. Considerations of heat conduction and thermal dissipation have led to various solutions in the prior art.

With reference to FIG. 2, a semiconductor package 200 has leads 205 and 210 fused with the lead frame pad 220. The shown configuration provides for a heat dissipation path through leads 205 and 210 which reduces the temperature of semiconductor package 200. Other solutions to the problem of thermal dissipation and heat conduction include bonding the MOSFETs and the IC to separate lead frame pads (not shown). In this configuration, heat generated by the MOSFETs is isolated to some extent from the IC which has a temperature upper limit that is lower than the temperature upper limit of the MOSFETs.

The semiconductor package 200 displays an improved thermal performance over the semiconductor package 100. In the semiconductor package 100, the thermal resistance of the MOSFETs was measured as 213° C./W and of the IC as 208° C./W. When 0.16 W was applied to the MOSFETs, the temperature of the MOSFETs was measured as 59.1° C. and the temperature of the IC as 58.3° C. In contrast, the thermal resistance of the MOSFETs of semiconductor package 200 was measured as 210° C./W and that of the IC as 206° C./W. When 0.16 W was applied to the MOSFETs, the temperature of the MOSFETs was measured as 58.6° C. and the temperature of the IC as 57.9° C. showing the improved thermal performance of semiconductor package 200.

While improvements in package thermal performance have been achieved in the prior art, there is a continued need for a composite TSSOP-8 semiconductor package having improved thermal performance. There is also a need for a package having additional heat dissipation paths.

SUMMARY OF THE INVENTION

The TSSOP-8 semiconductor package in accordance with the invention includes a common drain MOSFET pair bonded to a first lead frame die pad and an IC bonded to a second lead frame die pad. The first and second lead frame die pads are disposed a distance apart from one another to allow for an increased amount of encapsulant therebetween and to thereby provide for improved thermal performance of the package. Additionally, a pair of leads are fused to the first lead frame pad and a lead is fused to the second lead frame pad to provide for additional heat dissipation paths in the package.

In accordance with one aspect of the invention, a semiconductor package includes a lead frame having first and second die bonding pads, the first and second die bonding pads having a large lateral separation therebetween, a first device bonded to the first die bonding pad, a second device bonded to the second die bonding pad, a plurality of first leads coupled to the first die bonding pad, a plurality of second leads coupled to the second die bonding pad, and an encapsulant covering the lead frame, the first and second devices and at least a portion of the first and second pluralities of leads.

In accordance with another aspect of the invention, a TSSOP-8 composite semiconductor package includes a lead frame, a common drain MOSFET pair bonded to a first die bonding pad of the lead frame, an IC bonded to a second die bonding pad of the lead frame, a first plurality of leads coupled to the first die bonding pad, a second plurality of leads coupled to the second die bonding pad, an encapsulant covering the lead frame, the common drain MOSFET pair, the IC and at least a portion of the first and second plurality of leads, and wherein the first and second die bonding pads are separated a substantial distance laterally one from the other and the encapsulant disposed between the first and second die bonding pads provides for thermal dissipation therebetween.

In accordance with another aspect of the invention, a TSSOP-8 composite semiconductor package includes a lead frame having first and second die bonding pads, a first device bonded to the first die bonding pad, a second device bonded to the second die bonding pad, a plurality of first leads coupled to the first die bonding pad, a portion of the plurality of first leads being fused to the first die bonding pad, a plurality of second leads coupled to the second die bonding pad, a lead of the plurality of the second leads being fused to the second die bonding pad, and an encapsulant covering the lead frame, the first and second devices and at least a portion of the first and second pluralities of leads There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The present disclosure may be better understood and its numerous features and advantages made apparent to those skilled in the art by referencing the accompanying drawings.

DETAILED DESCRIPTION OF THE INVENTION

The present invention discloses a TSSOP-8 semiconductor package having improved thermal performance. The improved thermal performance is achieved by providing a package having first and second lead frame die pads disposed a distance apart from one another to allow for an increased amount of encapsulant therebetween. As the encapsulant includes a material having poor thermal conductivity, the increased amount of encapsulant provides a thermal barrier between common drain MOSFETs and an IC bonded to the first and second lead frame die pads respectively. Additionally, fused leads provide for additional thermal dissipation paths in the package.

Figure 1:
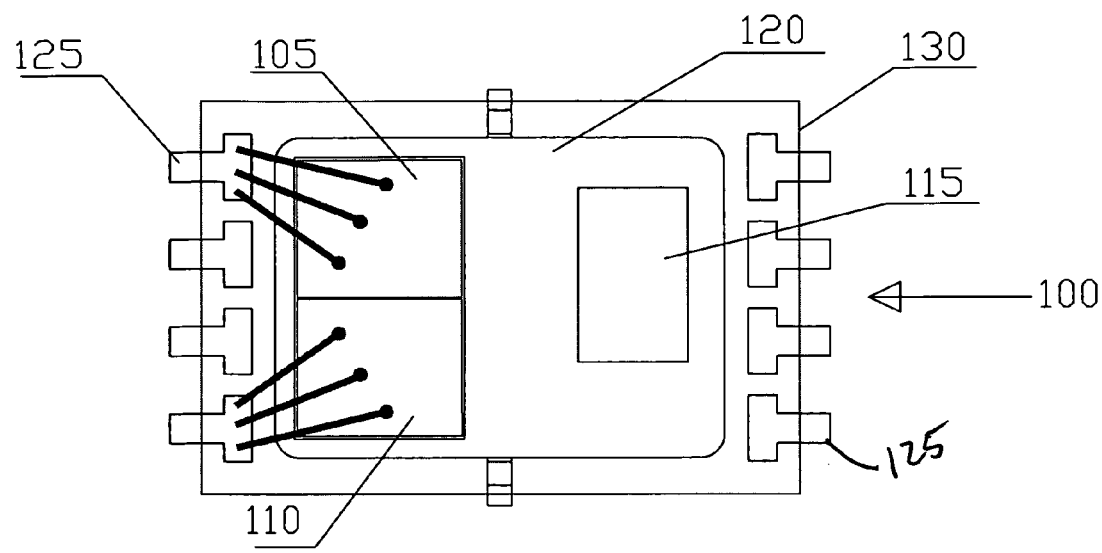
FIG. 1 is a schematic representation of a prior art TSSOP-8 semiconductor package.
Figure 2:
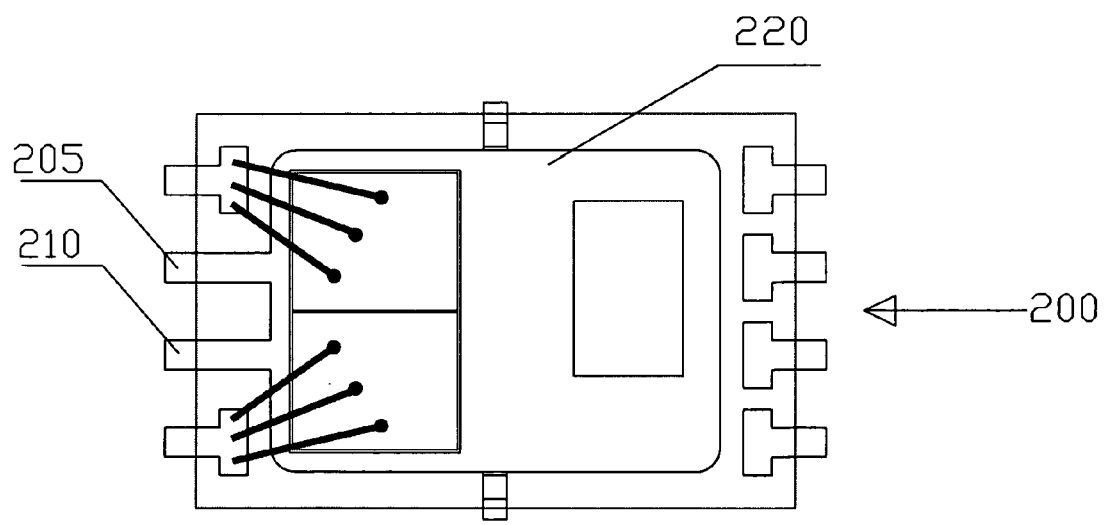
FIG. 2 is a schematic representation of another prior art TSSOP-8 semiconductor package.
Figure 3:
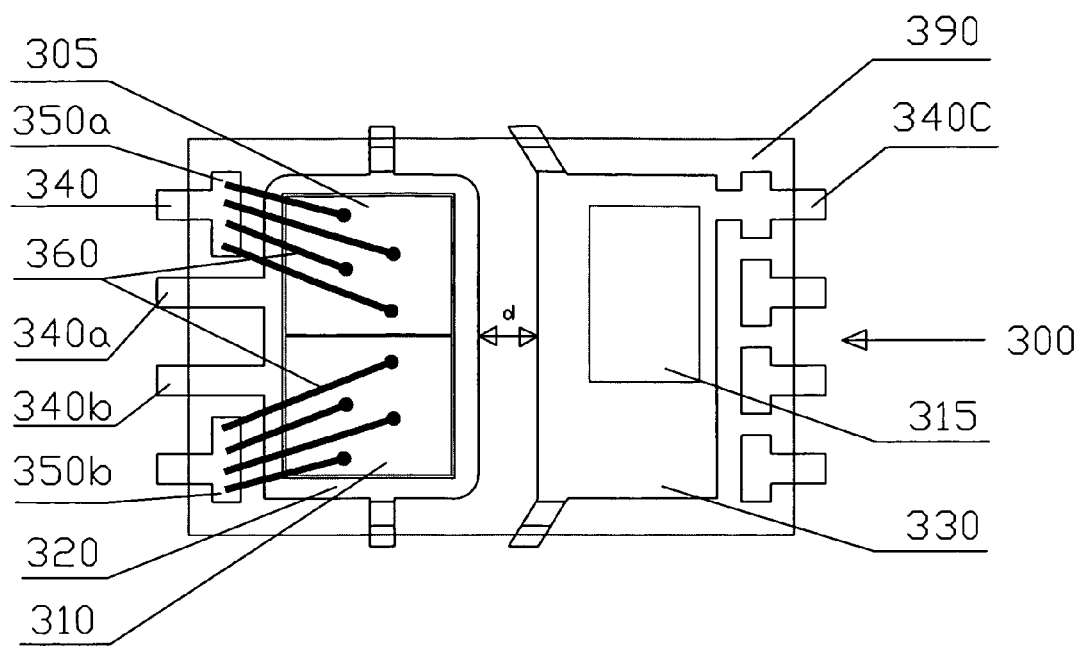
FIG. 3 is a schematic representation of a TSSOP-8 semiconductor package in accordance with the invention.

With reference to FIG. 3, a composite TSSOP-8 semiconductor package 300 is shown including a pair of MOSFETs 305 and 310 coupled in a common drain configuration. MOSFETs 305 and 310 may be electrically bonded to a first lead frame die pad 320. An IC 315 may be bonded to a second lead frame die pad 330. Edges of first and second lead frame die pads 320 and 330 may be disposed a distance "d" one from the other by reducing the size of second lead frame die pad 330. An encapsulant 390 may cover the MOSFETs 305 and 310, the IC 315, connecting wires and the first and second lead frame die pads 320 and 330 to provide a package body. An amount of encapsulant 390 may separate the MOSFETs 305 and 310 from the IC 315 to provide a thermal barrier between the MOSFETs 305 and 310 and the IC 315. This amount of encapsulant 390, being comprised of a material having poor thermal conductivity, may serve to provide a heat dissipating barrier between MOSFETs 305 and 310 and IC 315.

A plurality of leads 340 may extend from the encapsulant 390 for connection to a PCB. Leads 340a and 340b may be fused to the first lead frame die pad 320 to thereby provide a thermal dissipation path. Lead 340c may be fused to the second lead frame die pad 330 to provide another thermal dissipation path. Finally, source bonding areas 350a and 350b may be of increased area to enable the user of additional source bonding wires 360 to thereby further reduce heat generation within package 300.

The semiconductor package 300 displays an improved thermal performance over semiconductor packages 100 and 200 of the prior art. In the semiconductor package 300, the thermal resistance of the MOSFETs was measured as 197° C./W and of the IC as 142° C./W. When 0.16 W was applied to the MOSFETs, the temperature of the MOSFETs was measured as 56.5° C. and the temperature of the IC as 47.7° C. Thus, the semiconductor package 300 achieves improved thermal performance over prior art designs.

Figure 4:
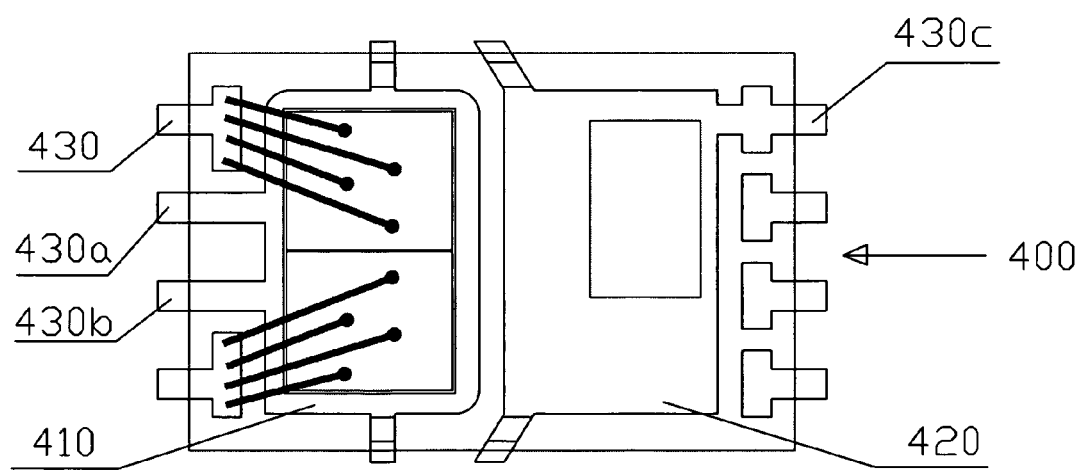
FIG. 4 is a schematic representation of an alternative embodiment of the TSSOP-8 semiconductor package in accordance with the invention.

An alternative embodiment of the composite TSSOP-8 semiconductor package 400 according to the invention is shown in FIG. 4. In contrast to the semiconductor package 300, semiconductor package 400 includes first and second lead frame die pads 410 and 420 displaced a conventional distance one from the other. Leads 430a and 430b may be fused to the first lead frame die pad 410 and lead 430c may be fused to the second lead frame die pad 420. In the semiconductor package 400, the thermal resistance of the MOSFETs was measured as 196° C./N and of the IC as 162° C./W. When 0.16 W was applied to the MOSFETs, the temperature of the MOSFETs was measured as 56.4° C. and the temperature of the IC as 50.9° C. These results confirm the effectiveness of the increased distance "d" provided between the first and second lead frame die pads 320 and 330 of semiconductor package 300 in increasing thermal dissipation in the package.

The composite TSSOP-8 semiconductor package of the invention provides a package having improved thermal performance. An increased amount of encapsulant between the MOSFETs and the IC in the package provides for a thermal barrier between the devices. A plurality of leads fused to lead frame die bonding pads provide additional heat dissipation paths. Finally, increased source bonding areas enable the user of additional bonding wires to further reduce the heat generation within the package.

It should be understood, of course, that the foregoing relates to preferred embodiments of the invention and that modifications may be made without departing from the spirit and scope of the invention as set forth in the following claims.

We claim:

1. A semiconductor package comprising:
   a lead frame having first and second die bonding pads, the first and second die bonding pads having a large lateral separation therebetween;
   a common drain MOSFET pair banded to the first die bonding pad;
   a second device bonded to the second die bonding pad;
   a plurality of first leads coupled to the first die bonding pad;
   a plurality of second leads coupled to the second die bonding pad; and
   an encapsulant covering the lead frame, the first and second devices and at least a portion of the first and second pluralities of leads.

2. The semiconductor package of claim 1, wherein the second device is an IC.

3. The semiconductor package of claim 1, wherein a portion of the plurality of first leads is fused to the first die bonding pad.

4. The semiconductor package of claim 1, wherein a lead of the plurality of the second leads is fused to the second die bonding pad.

5. The semiconductor package of claim 1, further comprising source bonding areas of increased area disposed within the encapsulant.

6. A TSSOP-8 composite semiconductor package comprising:
   a lead frame;
   a common drain MOSFET pair bonded to a first die bonding pad of the lead frame;
   an IC bonded to a second die bonding pad of the lead frame;
   a first plurality of leads coupled to the first die bonding pad;
   a second plurality of leads coupled to the second die bonding pad;
   an encapsulant covering the lead frame, the common drain MOSFET pair, the IC and at least a portion of the first and second plurality of leads; and
   wherein the first and second die bonding pads are separated a substantial distance laterally one from the other and the encapsulant disposed between the first and second die bonding pads provides for a thermal barrier therebetween.

7. The TSSOP-8 composite semiconductor package of claim 6, wherein a pair of the first plurality of leads are fused to the first die bonding pad.

8. The TSSOP-8 composite semiconductor package of claim 6, wherein a lead of the second plurality of lead is fused to the second die bonding pad.

9. The TSSOP-8 composite semiconductor package of claim 6, further comprising a pair of source bonding areas disposed within the encapsulant, the pair of source bonding areas having an increased area to accommodate an increased number of bonding wires.

10. A TSSOP-8 composite semiconductor package comprising:
    a lead frame having first and second die bonding pads;
    a common drain MOSFET pair bonded to the first die bonding pad;
    a second device bonded to the second die bonding pad;
    a plurality of first leads coupled to the first die bonding pad, a portion of the plurality of first leads being fused to the first die bonding pad;
    a plurality of second leads coupled to the second die bonding pad, a lead of the plurality of the second leads being fused to the second die bonding pad; and
    an encapsulant covering the lead frame, the first and second devices and at least a portion of the first and second pluralities of leads.

11. The TSSOP-8 composite semiconductor package of claim 10, wherein the second device comprises an IC.

12. The TSSOP-8 composite semiconductor package of claim 10, further comprising a pair of source bonding areas disposed within the encapsulant, the pair of source bonding areas having an increased area to accommodate an increased number of bonding wires.

* * * * *